United States Patent
Narendrnath et al.

(10) Patent No.: US 6,490,144 B1
(45) Date of Patent: Dec. 3, 2002

(54) SUPPORT FOR SUPPORTING A SUBSTRATE IN A PROCESS CHAMBER

(75) Inventors: Kadthala R. Narendrnath, San Jose, CA (US); Syed H. Askari, San Jose, CA (US); Dennis S. Grimard, Ann Arbor, MI (US); Surinder S. Bedi, Fremont, CA (US); Ananda H. Kumar, Milpitas, CA (US); Shamouil Shamouilian, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/450,791

(22) Filed: Nov. 29, 1999

(51) Int. Cl.[7] .............................................. H02N 13/00
(52) U.S. Cl. ..................................................... 361/234
(58) Field of Search ................................ 361/230, 233, 361/234, 235; 279/128; 264/263

(56) References Cited

U.S. PATENT DOCUMENTS

| | | | |
|---|---|---|---|
| 4,338,380 A | 7/1982 | Erickson et al. | 428/594 |
| 4,645,218 A | 2/1987 | Ooshio et al. | 279/1 M |
| 4,724,510 A | 2/1988 | Wicker et al. | 361/234 |
| 5,011,658 A | 4/1991 | Niedrich | 420/558 |
| 5,155,652 A | 10/1992 | Logan et al. | 361/234 |
| 5,191,506 A | 3/1993 | Logan et al. | 361/234 |
| 5,255,153 A | 10/1993 | Nozawa et al. | 361/234 |
| 5,280,156 A | 1/1994 | Niori et al. | 219/385 |
| 5,376,213 A | 12/1994 | Ueda et al. | 156/345 |
| 5,478,429 A | 12/1995 | Komino et al. | 156/345 |
| 5,529,657 A | 6/1996 | Ishii | 156/345 |
| 5,581,874 A | 12/1996 | Aoki et al. | 29/825 |
| 5,600,530 A | 2/1997 | Smith | 361/234 |
| 5,606,484 A | 2/1997 | Kawada et al. | 361/234 |
| 5,625,526 A | 4/1997 | Watanabe et al. | 361/234 |
| 5,671,116 A | 9/1997 | Husain | 361/234 |
| 5,691,876 A | * 11/1997 | Chen et al. | 361/234 |
| 5,737,178 A | 4/1998 | Herchen | 361/234 |
| 5,745,331 A | 4/1998 | Shamouilian et al. | 361/234 |
| 5,801,915 A | * 9/1998 | Kholodenko | 361/234 |
| 5,822,171 A | 10/1998 | Shamouilian et al. | 361/234 |
| 5,886,863 A | * 3/1999 | Nagasaki | 361/234 |
| 5,980,792 A | * 11/1999 | Chamlee | 264/40.1 |

FOREIGN PATENT DOCUMENTS

| | | |
|---|---|---|
| EP | 0512936 | 11/1992 |
| JP | 409045757 A | * 2/1997 |

OTHER PUBLICATIONS

IBM Technical Disclosure Bulletin, vol. 31, No. 1, Jun. 1988, pp. 462–464.

EWI Bulletin, "SP–100 Compliant Pad for High Thermal Stress Joints," 2 pages, No Date.

U.S. Patent Application entitled, Electrostatic Chuck Having Composite Base and Method; filed: May 7, 1999; Ser. No. 09/306,934; Inventors: Shamouilian, et al.

(List continued on next page.)

*Primary Examiner*—Ronald W. Leja
(74) *Attorney, Agent, or Firm*—Ashok Janah; Joseph Bach

(57) ABSTRACT

A chamber 30 for processing a substrate 25 comprises a support 55 comprising a dielectric 60 enveloping an electrode 70. The electrode 70 may be chargeable to electrostatically hold the substrate 25 or may be chargeable to form an energized gas in the chamber 30 to process the substrate 25. A base 130 is below the support 55, and a compliant member 300 is positioned between the support 55 and the base 130. The compliant member 300 may be adapted to alleviate thermal stresses arising from a thermal expansion mismatch between the dielectric 60 and the base 130.

65 Claims, 3 Drawing Sheets

OTHER PUBLICATIONS

U.S. Patent Application entitled, "Electrostatic Chuck Having Improved Electrical Connector and Method"; filed: May 7, 1999; Ser. No. 09/306,944; Inventors: Shamouilian, et al.

U.S. Patent Application entitled, "Compliant Bond Structure for Joining Ceramic to Metal"; filed: Jul. 29, 1998; Ser. No. 09/124,317; Inventors: Kumar, et al.

U.S. Patent Application entitled, "Polymer Chuck with Heater and Method of Manufacture"; filed Mar. 2, 1999; Ser. No. 09/261,083; Inventors: Bedi, et al.

Dupont Films, "Kapton KJ: Thermoplastic Polyimide Film", Dupont Films, Circleville, OH, Oct. 1993.

* cited by examiner ived, chipping, or breakage of the dielectric, or even failure of the electrical connection between the electrical connector and electrode. Also, even smaller microcracks are undesirable because the voltage applied to the electrical connector may dissipate through the microcracks. Thus, it is desirable to have an electrostatic chuck having a secure and reliable

SUPPORT FOR SUPPORTING A SUBSTRATE IN A PROCESS CHAMBER

BACKGROUND

The invention relates to a support for supporting a substrate in a chamber.

In the manufacture of integrated circuits, substrates are processed in a chamber by introducing process gas into the chamber and forming a plasma from the process gas. The substrate is typically supported on a support comprising dielectric covering an electrode. The electrode may be charged to electrostatically hold the substrate, to energize the process gas in the chamber, or both. In addition, a base below the support may comprise channels through which heat transfer fluid may be circulated to heat or cool the substrate.

Newly developed processes for the fabrication of integrated circuits are often performed at high temperatures and in highly erosive gases. For example, processes for etching copper or platinum are conducted at temperatures of from 250 to 600° C., compared to temperatures of 100 to 200° C. for etching aluminum. The high temperatures and erosive gases thermally degrade the materials used to fabricate the support. The high temperature requirement may be met by ceramic materials, such as aluminum oxide ($Al_2O_3$) or aluminum nitride (AlN). However, it is difficult to attach a ceramic dielectric to chamber components which are typically made from metal because the difference in thermal expansion coefficients of the ceramic and metal can result in thermal and mechanical stresses that can cause the ceramic to fracture or chip. Thus It is desirable to have a system for fastening a ceramic support to a chamber without causing excessive thermal stresses between the support and the chamber. In addition, it is desirable to have good or uniform heat transfer rates from the overlying substrate and the underlying structures, to maintain the substrate at uniform temperatures during processing.

Another problem that frequently arises with conventional electrostatic chucks is the difficulty in forming a secure electrical connection between the electrode of the electrostatic chuck and an electrical connector that conducts a voltage to the electrode from a terminal in the chamber. Conventional electrical connectors have spring biased contacts which may oxidize and form poor electrical connections to the electrode. Moreover, electrical connections formed by soldering or brazing the electrical connector to the electrode often result in weak joints that can break from thermal or mechanical stresses. Typically, a hole is machined in the dielectric to expose a portion of the electrode for electrical connection. The machining process causes small microcracks in the dielectric around the electrical connector, especially when the dielectric comprises a ceramic that is brittle. During operation, the support may be repeatedly thermally cycled between room temperature and higher temperatures which may exceed 200° C. The mismatch in coefficient of thermal expansion between the dielectric, electrode, and electrical connector can generate thermal stresses that are relieved along the cracks, thereby causing the cracks to propagate. The larger cracks can result in chipping or breakage of the dielectric, or even failure of the electrical connection between the electrical connector and electrode. Also, even smaller microcracks are undesirable because the voltage applied to the electrical connector may dissipate through the microcracks. Thus, it is desirable to have an electrostatic chuck having a secure and reliable electrical connection between the electrode and electrical connector and without microcracks in the dielectric.

Moreover, even when the support is used in low temperature processes, stresses exerted on the electrical connector during assembly and disassembly of the support, as is frequently necessary for cleaning or repairs, can cause the electrical connector to separate from the electrode. Typically, the electrical connector comprises a banana jack which is inserted into a receptacle in the base. The fit between the connectors is tight to ensure good electrical connection, thus considerable force is often needed to insert or remove the connector from its receptacle. This excess force often causes the electrical connector to separate from the electrode or to otherwise move and damage the dielectric. In addition, conventional support fabrication processes often result in a gap between the electrical connector and dielectric which can cause lateral or bending forces on the electrical connector that cause the electrical connector to separate from the electrode.

Thus, it is desirable to have a support that may be used at elevated temperatures, that reduces or alleviates thermal stresses arising from thermal expansion mismatches between the support and other underlying chamber components, and that provides good and uniform heat transfer rates therebetween. It is also desirable to have support and electrode assembly that has a securely bonded electrical connector that can withstand high temperatures and thermal cycling. It is further desirable for the support to provide uniform heat transfer rates. It is also desirable to have an electrode and electrical connector assembly that can withstand repeated connection an disconnection.

SUMMARY

In one aspect, support capable of processing a substrate comprises a dielectric enveloping an electrode, a base below the dielectric, and a compliant member between the dielectric and the base. The compliant member reduces thermal stresses between the dielectric and the base, and may also provide good heat transfer rates therebetween.

In another aspect, a chamber capable of processing a substrate, comprises a support comprising a dielectric enveloping an electrode, a base capable of supporting the support, and a compliant member between the support and the base.

In yet another aspect, a method for fabricating a support to support a substrate, comprises the steps of forming a support comprising a dielectric enveloping an electrode, forming a base adapted to support the support, and providing a compliant member between the support and the base.

In one aspect, the support for supporting a substrate in a chamber comprises a ceramic dielectric having a surface capable of receiving the substrate, an electrode below the ceramic dielectric, an electrical connector extending through a hole in the dielectric to connect to the electrode, and a polymer around a portion of the electrical connector.

In another aspect of the present invention, a substrate processing chamber comprises a support having a surface capable of receiving a substrate. The support comprises a ceramic dielectric enveloping an electrode, an electrical connector extending through the ceramic dielectric to connect to the electrode, and a polymer around a portion of the electrical connector. The substrate processing chamber further comprises a gas distributor, a gas energizer, and an exhaust, and a substrate supported on the support is capable of being processed by a process gas distributed by the gas distributor, energized by the gas energizer, and exhausted by the exhaust.

In another aspect, a method of fabricating a support for supporting a substrate comprises the steps of forming a dielectric covering an electrode, the dielectric having a hole which exposes a portion of the electrode, providing an electrical connector in the hole to electrically connect to the electrode, whereby microcracks or gaps are formed between the electrical connector, electrode, and dielectric, and infiltrating a polymer into the microcracks or gaps.

DRAWINGS

These features, aspects, and advantages of the present invention will become better understood with regard to the following description, appended claims, and accompanying drawings which illustrate examples of the invention, where:

FIG. 2b is a schematic top view of the electrode of FIG. 2a; and

DESCRIPTION

Figure 1:
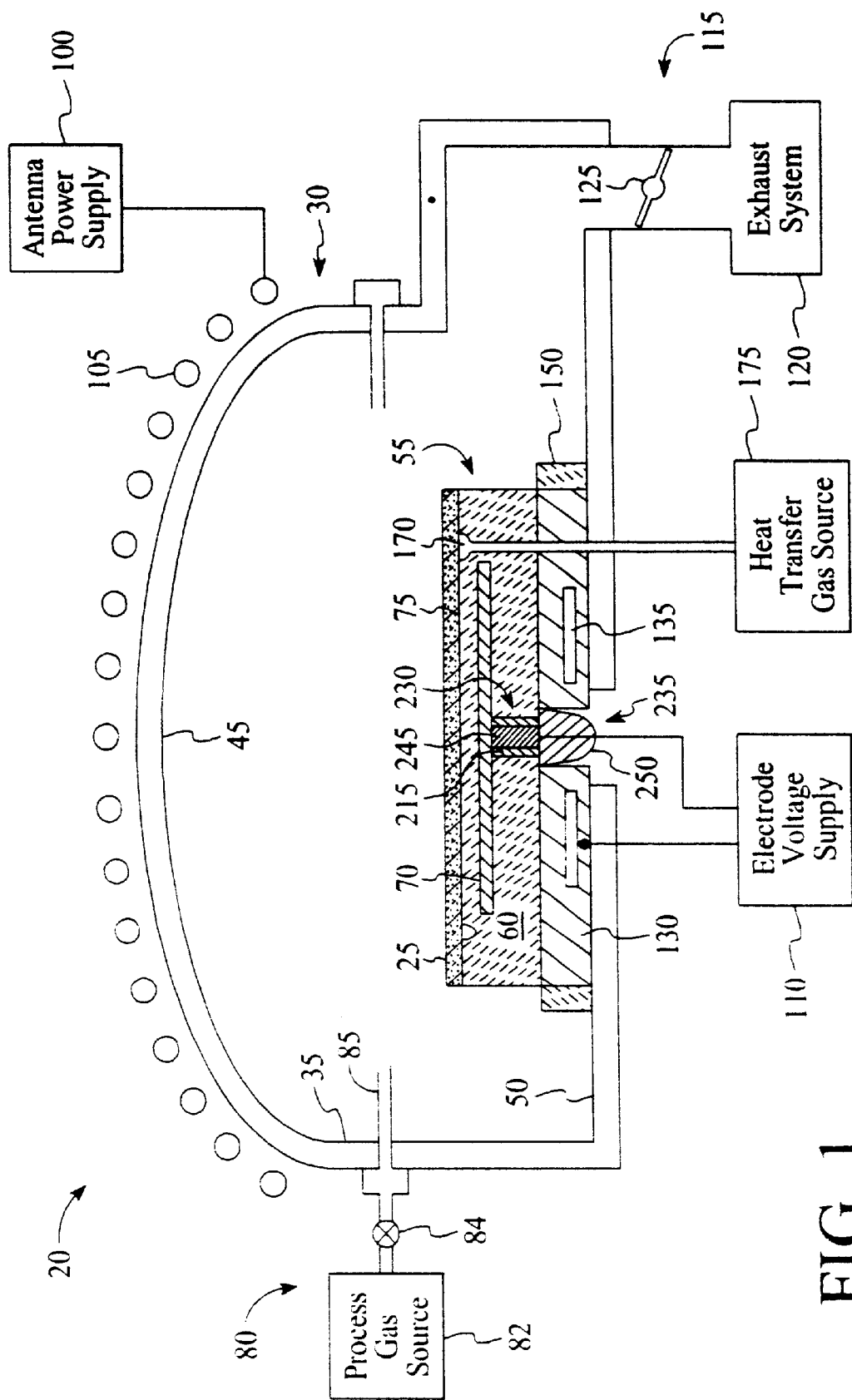
FIG. 1 is a schematic side view of a chamber and support according to the present invention.

An apparatus 20 for processing a substrate 25 in an energized gas or plasma, is for example, a "DPS" chamber as schematically illustrated in FIG. 1, an IPS chamber, or a MxP+ chamber-all of which are commercially available from Applied Materials, Inc., Santa Clara, Calif. The particular embodiment of the apparatus 20 shown herein is suitable for processing substrates 25 such as semiconductor wafers, and may be adapted by those of ordinary skill to process other substrates, such as flat panel display, polymer panels, or other electrical circuit receiving structures. The apparatus 20 is provided only to illustrate the invention, and should not be used to limit the scope of the invention or its equivalents to the exemplary embodiments provided herein. The apparatus 20 may be attached to a multichamber platform that contains and provides electrical, plumbing, and other support functions for the apparatus 20, such as for example, the Precision 5000™ systems from Applied Materials, Inc., of Santa Clara, Calif. The multichamber platform has the capability to transfer a substrate 25 between its chambers without breaking the vacuum and without exposing the substrate to moisture or other contaminants outside the multichamber platform. The different chambers may be used for different purposes in the entire process. For example, one chamber may be used for etching a substrate 25, another for the deposition of a material, and another for rapid thermal processing. The process may proceed uninterrupted within the multichamber platform, thereby preventing Contamination of a substrate 25 that may otherwise occur when transferring the substrate 25 between various separate individual chambers (not in a multichamber platform) for different processes.

Generally, the apparatus 20 comprises an enclosed chamber 30 having sidewalls 35, a ceiling 45 and a bottom wall 50 on which rests a support 55 for supporting the substrate 25. The support 55 comprises a dielectric 60 enveloping an electrode 70, and the dielectric 60 having a receiving surface 75 for receiving the substrate 25 thereon. Gas is introduced into the chamber 30 by a gas supply 80 comprising a plurality of nozzles 85 that are fed from a process gas source 82, the gas flow through the nozzles 85 being controlled by one or more gas valves 84. The gas is energized to form a plasma by coupling electromagnetic energy, such as RF or microwave energy, to the gas. In the apparatus 20 as shown in FIG. 1, the gas is energized inductively by applying an RF power from an antenna power supply 100 to an inductor antenna 105 adjacent to the ceiling 45 of the chamber 30. Optionally, the gas may also energized capacitively by applying an RF voltage from an electrode voltage supply 110 to the electrode 70 in the support 55, and electrically grounding the facing ceiling 45. Typically the frequency of the RF power applied to the inductor antenna 105 or electrode 70 is from about 50 KHz to about 60 MHz. Typically, the RF current at a power level of from about 750 to about 5000 Watts is applied to the inductor antenna 105; and an RF voltage is applied to the electrode 70 at a power level of from about 10 to about 5000 Watts. Spent gas and byproducts are exhausted from the chamber 30 through an exhaust system 115 which typically includes a vacuum pump 120 and a throttle valve 125 to control the pressure in the chamber 30. The apparatus 20 illustrated herein is used to etch material from the substrate 25, as generally described, for example, in *VLSI Technology*, by S. M. Sze, McGraw-Hill Publishing Company (1988), which is incorporated herein by reference.

In operation, the substrate 25 is transferred from a loadlock or transfer chamber and placed on the support 55. Generally, the support 55 also includes a base 130 for supporting the dielectric 60. Optionally, the base 130 may comprise channels 135 through which heat transfer fluid is circulated to heat or cool the substrate 25. Typically, the base 130 is shaped and sized to match the shape and size of the substrate 25 held on the support 55 to maximize transfer of heat between the base 130 and the substrate 25. For example, for substrates 25 having a disk shape, the base 130 comprises a right cylindrical shape. Typically, the base 130 is made at least partially from an electrically conducting material and may be surrounded by an insulating shield or jacket 150. The base 130 may be made out of a metal such as aluminum, and the jacket 150 may be made from an insulating material, for example, a polymeric or a ceramic material, such as quartz.

The dielectric 60 envelopes and electrically isolates the electrode 70 from the substrate 25 and the plasma in the chamber 30. The dielectric 60 may also comprises a gas conduit 170 extending therethrough to supply heat transfer gas from a heat transfer gas source 175 to an interface between the receiving surface 75 of the dielectric 60 and the substrate 25. The dielectric 60 may also comprise other holes and bores for the passage of electrical connectors, lift pins, and the like to promote heat transfer between the substrate 25 and the support 55. Typically, the dielectric 60 is made from a dielectric material that is resistant to erosion by the gas or plasma to provide a longer service life for the support 55. More preferably, the dielectric material comprises an absorption coefficient sufficiently low to permit an RF voltage applied to the electrode 70 to pass through the dielectric 60 and capacitively couple to the plasma below the ceiling 45 of the chamber 30. Preferably, the dielectric is a ceramic material, such as $Al_2O_3$, AlN, BN, Si, $SiO_2$, SiC, $Si_3N_4$, $TiO_2$, $ZrO_2$, cordierite, mullite, or mixtures and compounds thereof. However, the dielectric 60 may also be a polymer such as polyimide, polyamide, polyetherimide, polyketone, polyetherketone, polyacrylate, or fluoroethylene.

In one embodiment, the dielectric 60 comprises a high thermal conductivity ceramic material, such as aluminum nitride. The ceramic material may be also partially electrically conductive or semiconductive so that the dielectric 60 and underlying electrode may operate as a Johnsen-Rahbek chuck. The Johnsen-Rahbek chucks allow some current flow through the dielectric 60 to establish an accumulated electrostatic charge around the electrode 70 that is not confined to the electrode itself. This provides a higher clamping force for lower voltages as compared to conventional coulombic chucks. Generally, aluminum nitride is also preferred for its high thermal conductivity which provides high heat transfer rates from the substrate 25. Aluminum nitride also exhibits good chemical resistance to erosive environments, such as halogen-containing plasma environments. However, aluminum nitride has a coefficient of thermal expansion that makes it difficult to bond the ceramic to the metal wall or other metal structures in the chamber. In addition, it is also difficult to secure the dielectric 60 to the chamber when the chamber is operated at high temperatures. Also, microcracking and gaps in the brittle ceramic material may result in charge dissipation, poor electrical connection, or other problems during operation.

The electrode 70 that is at least covered by and below the dielectric 60 is capable of being electrically charged to electrostatically hold the substrate 25 to the receiving surface 75 of the dielectric 60, to energize a plasma from process gas, or both. For example, for a circular substrate 25 having a diameter of 200 to 300 mm (8 to 12 inches), the electrode 70 may comprise an area of from about 70 to about 70,000 $mm^2$. For electrostatic holding, the electrode 70 can comprise either a monopolar or bipolar electrodes. Typically, the electrode 70 comprises a layer or mesh of an electrically conducting material, such as a metal, for example, aluminum, copper, or molybdenum or mixtures thereof. In one version, the electrode 70 is made of molybdenum, which has a thermal conductivity of about 138 W/mK, which is substantially higher than other metals and enhances heat transfer rates from the substrate.

Figure 2A:
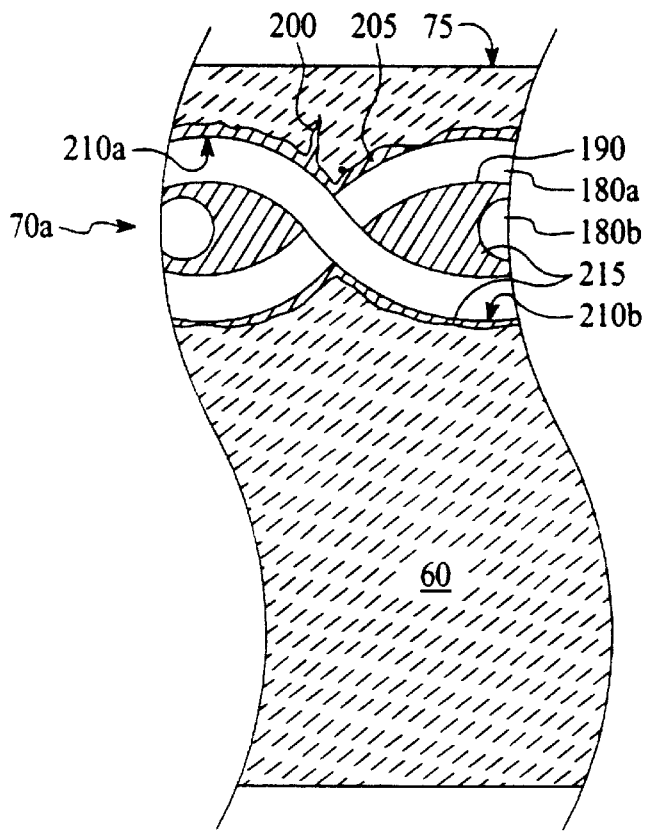
FIG. 2a is a schematic partial sectional side view of a support comprising an electrostatic chuck having a dielectric, electrode, and electrical connector and having microcracks and gaps around the electrode or electrical connector filled with a polymer.
Figure 2B:
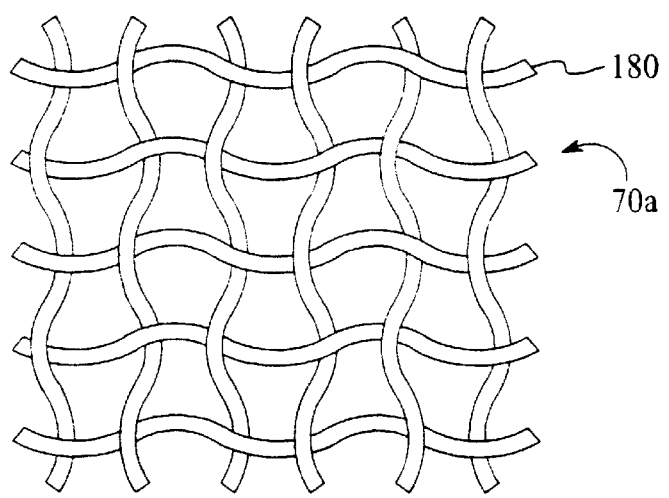

In another version, the electrode 70 comprises a mesh electrode 70a made of electrically conductive wires 180, each wire 180 having a longitudinal central axis that is oriented substantially parallel to the plane of the mesh electrode 70a. Because of voids or interstices 190 between the wires 180, the mesh electrode 70a comprises less metal than an equivalently sized solid electrode 70, and consequently is subject to less thermal expansion. More preferably, the interstices 190 between the wires 180 are sufficiently small to allow the mesh electrode 70a to generate a uniform electrostatic field for holding the substrate 25 upon application of a voltage thereto, and sufficiently large to minimize the thermal expansion of the mesh electrode 70a. The mesh electrode 70a can also comprise bundles of wires 180 woven or felted together in a gauze, or a gauze of randomly interlocking wires 180. For example, in one version, as shown in FIGS. 2a and 2b, the mesh electrode 70a comprises wires 180 that interlock at right angles to one another with first strands 180a looping around perpendicular second wires 180b. The wires 180 typically comprise a diameter of from about 0.001 to about 0.5 mm.

Microcracks and Gap Filling Polymer

The thermal expansion mismatch between the electrode 70 and dielectric 60 may result in microcracks 200 and voids 205 in surfaces 210a,b of the dielectric 60 near the electrode 70. These cracks 200 and voids 205 can lead to separation of the dielectric 60 from the electrode 70 during fabrication of the support 55 or during processing of a substrate 25 held on the support 55. In one aspect of the invention, a polymerizable material or a polymer 215 is infiltrated between the surfaces 210a,b of the dielectric 60 and the electrode 70 to substantially fill these cracks 200 and voids 205, thereby reducing or eliminating the incidence of delamination of the dielectric 60. The polymer 215 may also substantially fill the interstices 190 between the strands 180 of the mesh electrode 70a version.

The polymer 215 can comprise any material that readily undergoes polymerization which is a chemical reaction in which two or more small molecules continue to form larger molecules that contain repeating structural units of the original molecules. Suitable materials include, for example, adhesives, pastes, liquids, and gels comprising polyimide, polyketone, polyetherketone, polysulfone, polycarbonate, polystyrene, nylon, polyvinylchloride, polypropylene, polyetherketones, polyethersulfone, polyethylene terephthalate, fluoroethylene propylene copolymers, cellulose, triacetates, silicone, and rubber or mixtures thereof. In one embodiment, the polymer 215 has a coefficient of thermal expansion (CTE), which is nearly equal to that of the dielectric 60 and the electrode 70. A polymer 215 having a CTE considerably higher or lower than that of the dielectric 60 or the electrode 70 can actually increase the incidence of delamination. It has been discovered that for a dielectric 60 made of aluminum nitride (which has a CTE of about 5.5 ppm/°C.) and an electrode 70 made of molybdenum (which has a CTE of about 5.1 ppm/°C.) a suitable polymer 215 has a CTE of from about 3 to about 8 ppm/°C. In addition, the polymer 215 may also have a high thermal conductivity to provide good heat transfer to or from the substrate 25 through the dielectric 60, and be capable of withstanding operating temperatures of 100 to 200° C. The polymer 215 should also have a dielectric strength sufficiently high and an absorption coefficient sufficiently low to permit an RF voltage applied to the electrode 70 to pass through the polymer 215 and dielectric 60 to capacitively couple to the gas in the chamber 30. In addition, the polymer 215 preferably has a viscosity sufficiently low to enable it to infiltrate the cracks 200 and voids 205 between the electrode 70 and the dielectric 60 and/or the interstices 190 between the strands 180 of the mesh electrode 70a.

In one embodiment, the polymer 215 comprises a cyanoacrylate, which is an adhesive that cures rapidly to form a high strength bond. Using a cyanoacrylate for the polymer 215 further reduces the incidence of separation of the dielectric 60 from the mesh electrode 70a. Suitable cyanoacrylates include methyl, ethyl, propyl, butyl, methoxyethyl and allylester cyanoacrylates or mixtures thereof. A preferred cyanoacrylate comprises ethyl cyanoacrylate, such as SUPERGLUE™ commercially available from LOCTITE of USA. Ethyl cyanoacrylate also has a high thermal conductivity and is able to withstand temperatures of up to about 120° C. In addition, ethyl cyanoacrylate has an RF absorption coefficient sufficiently low not to interfere with the functioning of the electrode 70. In addition, ethyl cyanoacrylate has higher elasticity than other cyanoacrylates, which provides greater resistance to mechanical impacts and thermal shock. Ethyl cyanoacrylate comes in a liquid form having a viscosity of about 6 centipoise, sufficiently low to enable it to be easily infiltrated into interstices 190 between the mesh electrode 70a and the dielectric 60.

The infiltration can be accomplished by, for example, maintaining the polymer 215 in an uncured liquid state and bringing the polymer 215 into contact with an exposed portion 220 of the mesh electrode 70a through a hole 225 in the dielectric 60. The polymer 215 infiltrates by capillary action the interconnecting cracks 200 and voids 205 between the mesh electrode 70a and the dielectric 60 or the interstices 190 between the strands 180 of the mesh electrode 70a. Infiltration can also be done in a pressure vessel (not shown) using a pressure infiltration process. In this method, the dielectric 60 with the mesh electrode 70a embedded therein is placed in the pressure vessel and the vessel evacuated and heated to remove air from the voids. Once the pressure vessel is evacuated, the polymer 215 is introduced into the pressure vessel under pressure to fill substantially all cracks 200 and voids 205 in the dielectric 60 and all interstices 190 between the strands 180 of the mesh electrode 70a.

Figure 3:
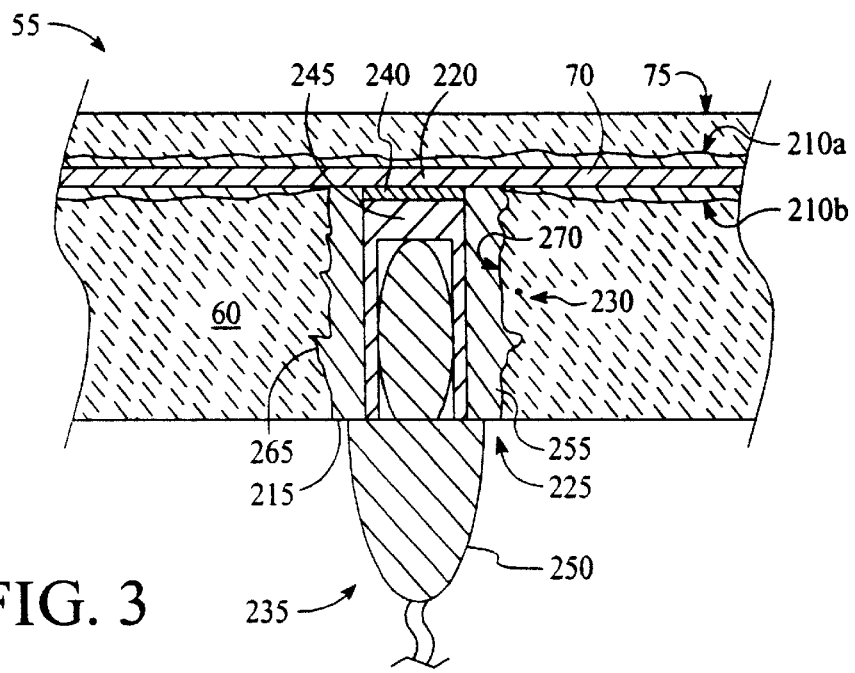
FIG. 3 is a schematic partial sectional side view of another support according to the present invention.

As shown in FIG. 3, the support 55 further comprises an electrical connector 230 which passes through the hole 225 to electrically connect the voltage supply terminal 235 in the chamber 30 to the electrode 70. The electrical connector 230 is also made of a refractory metal, suitable metals including for example, tungsten, titanium, nickel, tantalum, molybdenum or alloys thereof. The electrical connector 230 may comprises a rod or plug having a length sufficiently long to extend from the voltage supply terminal 235, through the hole 225 in the dielectric 60 to electrically engage the electrode 70. Other equivalent structures for the electrical connector 230 include rectangular leads, contact posts, and laminated conducting structures. The electrical connector 230 terminates in a banana jack 245 which receives a banana plug 250 on the voltage supply terminal 235.

Typically, the electrical connector 230 is electrically connected to the electrode 70 by a brazed joint 240. By brazing it is meant bonding using an alloy having a melting point lower than either of the members being joined. In this method, a metal shim (not shown) is placed between the electrical connector 230 and the electrode 70. The shim is melted to form the brazed joint 240 between the electrical connector 230 and the electrode 70. Alternatively, the brazing metal can be deposited directly on the surfaces to be joined and heated to form the bond. The brazing alloy typically comprises aluminum, zinc, copper, silicon, or alloys thereof; and more typically, brazing alloy is aluminum based and melts at about 550° C. The high thermal expansion mismatch between the aluminum-containing brazing alloy (CTE of about 25 ppm/°C.) and the ceramic dielectric (AlN has a CTE of 4.5 ppm/°C.), often causes additional microcracks around the electrode 70 and electrical connector 230, which are filled with the previous polymer infiltration step.

The annular gap 255 between the electrical connector 230 and a surface 270 of the hole 225 renders the electrical connector 230 susceptible to lateral or bending forces which are inadvertently applied during the assembly or disassembly of the support 55 from the voltage supply terminal 235. These forces can cause separation of the electrical connector 230 from the electrode 70 or can damage to the dielectric 60. Also, the process of drilling or machining the hole 225 in the dielectric 60 can cause fissures or cracks 265 to form in a surface 270 of the hole 225. The repeated heating and cooling of the support 55 during processing of substrates 25 cause the cracks 265 to propagate through the dielectric 60, which in turn may lead to a catastrophic failure of the support 55. This is particularly a problem for a dielectric 60 comprising a brittle ceramic material. Also, the force required to remove the banana plug 250 of the voltage supply terminal 235 from the banana jack 245 of the electrical connector 235 may also cause the electrical connector 230 to separate from the electrode 70 and break its electrical connection. Thus, in another aspect of the present invention, the polymer 215 is also infiltrated into the annular gap 255 to seal the gap and the surrounding surfaces 270 of the hole 225, thereby providing a support 55 that is more resistant to failure from crack propagation and that can withstand repeated assembly and disassembly from the voltage supply terminal 235.

Table I illustrates the increase in tensile strength and bend strength for a support 55 in which the gaps 255 are substantially filled with a polymer 215. By tensile strength it is meant the maximum force that can be applied along a longitudinal axis of the electrical connector 230 before it breaks or separates from the electrode 70. Bend strength refers to the maximum force that can be applied perpendicularly to the longitudinal axis of the electrical connector 230 without causing it to separate from the electrode 70 or otherwise damage to the dielectric 60. In these examples, test coupons comprising aluminum nitride having a molybdenum mesh embedded therein were scaled down to approximate the dimensions of a support 55. Electrical connectors 230, also scaled down, were brazed to the mesh in the coupons through holes in the aluminum nitride to define an annular gap having a width of about 8 mils. In one of the test coupons, ethyl cyanoacrylate was infiltrated by the process of the present invention to substantially fill the interstices 190 of the mesh and the annular gap 255. Thereafter, the tensile strength of the bonded electrical connector 230 and electrode 70 was measured by pulling apart the bond. It is seen from the results in Table I, that the electrical connector 230 of a support 55 according to the present invention, is many times stronger than a that of a conventional support without a polymer.

TABLE I

| Support | Tensile Strength (lbs) | Bend Strength (lbs) |
| --- | --- | --- |
| Without polymer in gap | 10 to 110 | 7 to 25 |
| With polymer in gap | 400 to 550 | 45 to 54 |

Compliant Member Between Dielectric and Base

Figure 4:
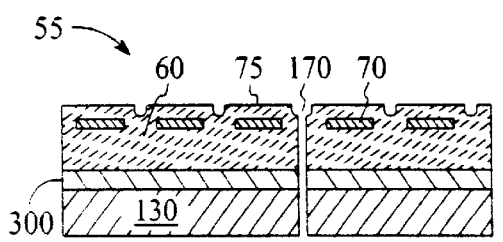
FIG. 4 is a schematic sectional side view of a support comprising a compliant member containing a polymer.

In another embodiment, a compliant member 300 is positioned between the dielectric 60 and the base 130, as for example, illustrated in the exemplary embodiment shown in FIG. 4. The compliant member 300 is ductile and compliant to provide an interface that absorbs the thermal stresses arising from the thermal expansion mismatch between the dielectric 60 and the base 130. While a bonded joint between the dielectric 60 and base 130 may provide uniform heat transfer rates, it is often difficult for a bonded joint to withstand the thermal stresses arising from differences in thermal expansion coefficients of dissimilar materials, such as a ceramic dielectric and metal base. However, the compliant member 300 can flex and absorb any thermal stresses that arise from the difference in thermal expansion coefficients of the dielectric 60 and base 130. In addition, the compliant member 300 may also serve to reduce leakage of heat transfer gas passing through the conduit 170 to the process chamber.

Preferably, the compliant member 300 comprises a polymer layer which is compliant and able to absorb thermal stresses. Suitable polymers include, for example, adhesives, pastes, liquids, and gels comprising polyimide, polyketone, polyetherketone, polysulfone, polycarbonate, polystyrene, nylon, polyvinylchloride, polypropylene, polyetherketones, polyethersulfone, polyethylene terephthalate, fluoroethylene propylene copolymers, cellulose, triacetates, silicone, and rubber or mixtures thereof. In addition, the polymer layer may also has a high thermal conductivity and be capable of withstanding operating temperatures. The polymer layer may be sufficiently compliant to withstand a CTE mismatch between the dielectric 60 and the base 130 of at least about 15%, and preferably comprises a low elastic modulus of about $10 \times 10^3$ to about $100 \times 10^3$ psi, which can withstand a CTE mismatch of up to 600% between the dielectric 60 and the base 130.

In one version, the polymer layer comprises a thermoplastic adhesive that is reworkable and is not completely polymerized at high temperatures. Thermoplastics remain compliant and allow the bonding of materials having a large thermal expansion mismatch because they do not set and that have a relatively low softening point of less than about 500° C. These polymers also have a low elastic modulus of about $60 \times 10^3$ psi. Suitable thermoplastic adhesive polymers comprise for example, the STAYSTIK thermoplastic adhesive no 672 commercially available from Alphametals, Inc., Jersey City, N.J.; which has an attachment temperature of about 125 to 200° C., a continuous use temperature of about −65 to 150° C., and a thermal conductivity in the range of about 1 W/(m-°C.).

Figure 5:
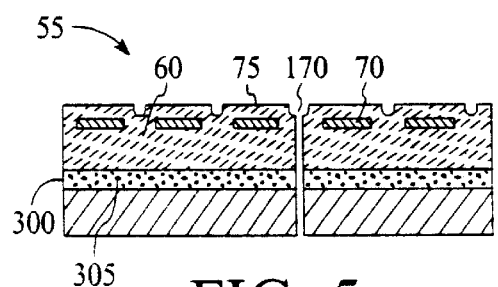
FIG. 5 is a schematic sectional side view of a support comprising a member comprising thermally conductive particulates.

The thermal conductivity of the polymer layer can be enhanced by adding particulates 305 having a higher thermal conductivity than the polymer layer, such as for example, ceramic and metal particulates 305, as illustrated in FIG. 5. Preferably, the particulates 305 comprise a thermal conductivity of from about 2 to about 200 w/m-k. Suitable ceramic particulates include alumina, aluminum nitride, boron nitride, or mixtures thereof; of which aluminum nitride is preferred because of its high thermal conductivity. The particulate has a small grain size of less than about 50 $\mu$m, and more typically from about 0.5 to about 50 $\mu$m, is dispersed in the polymer layer in a volumetric ratio from about 10% to about 80%, and more typically from 20% to 50%.

Figure 6:
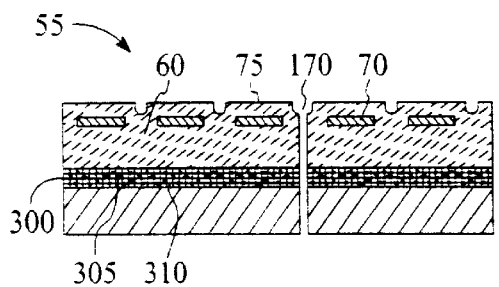
FIG. 6 is a schematic sectional side view of a support comprising a compliant member comprising a matrix such as a metal mesh.
Figure 7:
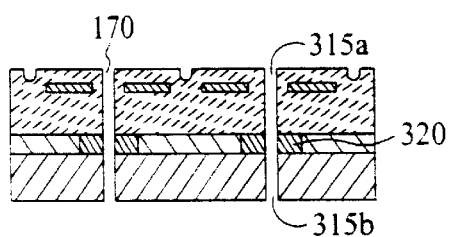
FIG. 7 is a schematic sectional side view of a support comprising a compliant member comprising rings around aligned bores in the support.

In addition, the compliant member 300 may also comprise a metal matrix 310, in the form of a mesh or other three dimensional structure that serves to stiffen and support the polymer layer yet still provide a compliant structure, as for example, illustrated in FIG. 6. The metal matrix 310 may comprise a mesh of interlocking wires or strands, a punched out mesh, or a honeycomb structure. Suitable metal materials include aluminum, copper, or stainless steel. The polymer layer infiltrates the metal matrix 310 to form the compliant member 300. The infiltrated structure may be prefabricated and then inserted between the dielectric 60 and base 130, or may be formed in situ. Another advantage of the metal matrix 310 is that it distributes any applied thermal load uniformly across the compliant member 300.

In yet another embodiment, the support 55 comprises a dielectric 60 having a first bore 315a and the base 130 comprises a matching second bore 315b. The bores 315a,b are aligned to one another, for example to serve as a portion of the conduit 170 that is used to transfer heat transfer gas to the receiving surface of the support 55. The aligned bores 315a,b may also serve as a passage to pass lift pins (not shown) therethrough, the lift pins being useful to lift and lower the substrate 25 from the support 55 before and after processing of the substrate. In this version, a ring 320 is positioned around the interface of the two aligned bores 315a,b. The ring 320 serves to reduce leakage of polymer into the bores 315a,b during fabrication and may also serve to limit any flow of softening polymer that occurs during operation of the support 55.

The ring 320 may also advantageously be selected to have a thickness in relation to a desirable thickness of the compliant member 300 between the dielectric 60 and the base 130. For example, the ring 320 may have a thickness that is about the same as the desired thickness of the compliant member 300 comprising polymer. The ring 320 serves to space apart and separate the dielectric 60 and the base 130 from one another so that the desired thickness is achieved. When a polymer in the form of a film is used to fabricate the compliant member 300, as described herein, the thickness of the ring 320 may be smaller than the thickness of the polymer film, for example about 10% smaller, to provide the desired final thickness. In addition, the ring 320 may have a diameter that is about 10% larger or smaller than the diameter of the bores 315a,b through the dielectric 60 and base 130 to compensate for polymer flow around the ring 320 during fabrication. Typically, the ring 320 has a thickness of about 0.05 to about 0.5 mm and a diameter of about 2 to about 50 mm.

In one method of fabrication, a pressure forming process is used to form the support 55 by bonding the compliant member 300 to the dielectric 60 and base 130. In this method, a polymer film loaded with particulates 305, such as the aforementioned the STAYSTIK thermoplastic adhesive no 672 is placed on the base 130 and the preformed dielectric 60 is positioned thereon. This assembly is then placed in a pressure forming apparatus (not shown) which is maintained at a pressure of about 10 to about 500 psi (500 to 30,000 Torr). When the film comprises a thermoplastic adhesive, lower pressures are preferred to avoid excessive squeezing out too much of the polymer adhesive, the pressures typically ranging from about 10 to 25 psi (500 to 13,000 Torr). The assembly is then heated to a temperature sufficiently high to soften and bond the polymer film to the dielectric 60 and base 130. A typical cycle comprises temperatures of 30 to 120° C., a pressure of about 200 psi (10,000 Torr) and a total time of about 30 minutes. Preferably, the heat treatment temperature is chosen to be close to the operating temperature of the dielectric 60 and base 130, so that the polymer will withstand at least those temperatures without excessive outgassing, flow or other problems. Simultaneously with applying a pressure and temperature on the assembly it may also be desirable to evacuate and remove air trapped between the film and the dielectric 60 or base 130 using conventional vacuum bag methods, as for example, described in U.S. Pat. No. 5,745,331.

Conventional pressure forming processes are generally described in Allen J. Kling, *Curing Techniques for Composites, Advanced Composites,* April, 1985, which is incorporated herein by reference. Suitable pressure forming apparatus include autoclaves, platen presses or isostatic presses. Typical autoclaves comprise pressure resistant steel chambers having diameters ranging from about 1 to 10 feet. A pressurized nonreactive gases such as carbon dioxide or nitrogen may be used to pressurize the autoclave. Suitable autoclaves include those fabricated by "BARON AUTOCLAVES," Santa Fe Springs, Calif.; "AOV INDUSTRIES" in Anaheim, Calif.; and "MELCO STEEL," in Azusa, Calif. Instead of using an autoclave, a platen press or isostatic press can also be used.

EXAMPLES

The following examples illustrate fabrication and testing of a support 55 according to the principles of the present invention; however, the support 55 may be used in other applications as would be apparent to those skilled in the art, and the scope of the present invention should not be limited to the illustrative examples provided herein.

Example 1

A support 55 comprising AlN ceramic dielectric 60 having a molybdenum mesh electrode 70 was machined with a bore 315a to expose a portion of the electrode 70, and an electrical connector 230 shaped as a post was positioned in the bore 315a to contact the exposed portion of the electrode 70, and bonded to the electrode 70 with an aluminum brazing alloy. An annular gap 255 of about 8 to 10 mils and surrounding microcracks 200 between the electrical connector 70 and the bore 315a in the exposed surfaces was filled with a polymer adhesive, namely the aforementioned SUPERGLUE™. The support 55 was repeatedly installed and electrical connected and then disconnected to a voltage supply terminal in an MxP+ chamber (not shown), commercially available from Applied Materials, Santa Clara, Calif. Four different operators were used to perform this procedure to get a range of movements and emulating normal operation procedures. It was discovered that the electrical connector 70 withstood the assembly and disassembly for 40 times without failure, demonstrating the superiority of the polymer adhesive in increasing the strength of the bond. In addition, the tensile strength of the brazed and bonded electrical connector 70 was estimated by increasing a load applied to the electrical connector until the braze or bond failed. The failure load was determined to be almost times higher than the failure load of conventional electrical connector 70.

Example 2

In these examples, compliant members 300 were fabricated using different materials to test their ability to withstand at least a 15% mismatch in coefficient of thermal expansion between a ceramic dielectric 60 and a metal base 130 under high bias plasma conditions.

The compliant materials included polymers such as pressure-sensitive adhesives, such as acrylics; and organics such as polyurethanes and bis-phenol A. Test substrates for testing the compliant member 300 were fabricated from Pyrex™ glass plate commercially available from Corning Works, Corning, N.Y., and a metal plate of aluminum. These two materials had a thermal expansion mismatch of about 800% which provided a suitable test specimen. In addition, the bonded area of the two substrates of about 80 in$^2$ was about 60% larger than the bonding area of an actual support to provide a high safety margin for testing.

In some of the examples, compliant members 300 comprising a layer of material was used to join a Pyrex™ glass plate to an aluminum oxide plate. The bonded plates were tested over a temperature range of −20 to 120° C. The compliant member 300 kept the two plates bonded together even through the large range of temperatures.

After the initial tests, a compliant member 300 was fabricated to join an aluminum nitride ceramic dielectric 60 to an aluminum base 130. This compliant member 300 was fabricated by mixing an adhesive polymer comprising acrylics or polyurethanes with a 0–40% volume fraction of a high thermal conductivity filler material such as $TiB_2$, AlN, $Al_2O_3$, BN or mixtures thereof, and using an aluminum mesh to support the adhesive polymer. The dielectric 60, base 130, and compliant member 300 were jointed to one another in an autoclave at a temperature cycle as shown in Table II. The bonded support 55 exhibited excellent tensile and shear strength for a wide range of bonding temperatures. A temperature about half way in-between the two operational temperature extremes of the dielectric 60 and the base 130 was chosen as the bonding temperature to provide a more stable support 55 across at those temperatures.

TABLE II

| | | Results of Bonding | | | |
|---|---|---|---|---|---|
| Bonding Temperature, | Soak Time, | Applied Pressure, | Bonding Time, | % Area of Adhesion (visual) before and after bonding | |
| ° C. | mins | psi | mins | Before | After |
| 30 | 60 | 200 | 30 | <10 | 100 |
| 60 | 60 | 200 | 30 | <10 | 100 |
| 80 | 60 | 200 | 30 | <10 | 100 |
| 100 | 60 | 200 | 30 | <10 | 100 |

Thereafter additional tests were conducted to evaluate other properties of the compliant member 300. These included chemical tests, temperature gradients, temperature cycling and thermal shock, strain localization, flatness and adhesion property measurements, computer simulations, helium leak testing, and dye penetrant tests.

Chemical Analysis

Chemical analysis of the compliant member 300 was performed using an ICP-MS (inductively coupled plasma-mass spectrometer) set to indicate low metal contamination. The results as shown in Table III indicate sufficiently low impurity levels to utilize a compliant member 300 in a vacuum environment.

TABLE III

| ICP-MS Trace Element Chemical Analysis of Bond Material | | | | | | | | |
|---|---|---|---|---|---|---|---|---|
| Element | Na | K | V | Cr | Cu | Zn | Ag | Sn |
| μg/g (ppm) | 4 | 2 | <1 | 5 | 9 | 12 | 0.1 | 1 |

Thermal Drop

A test measurement unit was specifically designed and built to test the temperature drop across the thickness of the compliant member 300 to determine its approximate thermal conductivity. A heat load of about 1500 Watts was applied to an upper aluminum block positioned on the compliant member 300, and a lower aluminum block below the compliant member 300 was maintained at −10° C. The temperature drop across the area of the compliant member 300 of about 50 in$^2$ was measured to be about 10° C. by embedded thermocouples. This temperature drop was the same at the center of the compliant member 300 as well as at 0.5 inches from the edge. This highly uniform thermal conductivity or thermal impedance across from the center to the edge of this compliant member 300 was very good, and it is believed this results from the embedded aluminum mesh layer that rapidly allows the heat to spread in the X-Y plane and thereby minimizing temperature differentials from one area to another. The thermal conductivity value calculated by conventional ASTM methods, was about 1.4 w/mk, and within 10% of the specified value of the 1.4 w/mk.

Thermal Cycle and Thermal Shock

Thermal cycling measurements were performed on the compliant member 300 in an automated unit with air-to-air cooling and heat transfer. In addition, more severe liquid-to-liquid thermal shock cycling between −20° C. and +120° C. was also performed. Typically, a support specimen comprising glass plate, compliant member 300, and aluminum plate was subjected to 100 thermal shock cycles with the specimen maintained at either of the extreme temperatures for about five minutes during each cycle to allow the temperature to stabilize. Integrity of the bond interface of the glass plate compliant member 300 and the other bond interface between the aluminum plate and the compliant member 300 were periodically checked prior to and after thermal cycling and thermal shocks by ultrasonic imaging through the thickness of the specimen. The ultrasonic results showed little or no change in the cohesiveness of the interface, clearly demonstrating that the compliant member 300 provided a bond which successfully withstood the severe thermal expansion stresses over this temperature range.

Strain Localization

A strain localization test method was used to determine if the maximization of the thermal strain caused by thermal expansion at the circumference of the compliant member 300, especially around the conduits 170 for providing heat transfer gas through the support 55, could lead to localized strains and failure. In this method, copper fiduciaries were sputtered deposited on the bonding surface of a glass plate. Copper adheres poorly to glass, and thus easily transfers to the bond interface and will reflect any movement caused by thermal strains at the bond interface. The distortion of the fiduciaries can be monitored after subjecting the specimen to repeated thermal cycling or thermal shock. Tests performed by this method did not show any discernable distortions in the sputtered copper fiduciaries, indicating little or no thermal strain on the circumference of the compliant member 300.

The flatness of the receiving surface 75 of the support 55 is important because it affects the rate at which heat transfer gas leaks out from under the substrate 25 at the circumference of the support 55. The flatness is typically affected by the stiffness or elastic modulus. For example, if the bond interface is formed by brazing, the support 55 with the dielectric 60, brazed bond and the base 130 have a severe coefficient of thermal expansion mismatch because of the two different metals which lead to a bimetal- or trimetal-type expansion, causing bending of the entire support 55 in one direction or another. Therefore, the flatness measurements were made on a test specimen over a range of temperatures from room temperature to 100° C. to verify that the support 55 would remain flat with the entire temperature range. The results indicated little or no distortion which was a very different result as compared to the high stiffness bond materials such as brazing, which often caused bending of up to 0.5 mm, which is higher by a factor of about 100.

Adhesion Property Measurements

Some specimens were tested specifically to determine the adhesion strength of the bond between a glass plate, compliant member 300, and aluminum plate. These adhesion tests were conducted under die shear, double lap shear, and tensile cool conditions. The tensile and double lap shear tests were carried out at room temperature using an INSTRON™ testing machine. The test strength was measured by a commercial shear testing unit. The test was conducted at both room temperature at 120° C. The die shear samples were also subjected to a liquid-to-liquid thermal shock test and further tested at room temperature at 120° C. In these specimens, a ceramic plate sized about 0.5×0.25 inch in area was bonded to an aluminum plate sized about 0.5×0.5 inch in area. The tests results are shown in Table IV.

TABLE IV

Results of Adhesion Tests

| Test | Test Temperature, ° C. | Strength, psi |
| --- | --- | --- |
| Tensile pull | RT | 48 |
| Double lap shear | RT | 9 |
| Die shear | RT | 171 |
|  | 120 | 18 |
| Die shear (after −20° C. to + 120° C. thermal shock) | RT | 221 |
|  | 120 | 18 |

Computer Simulation

Final element analysis was used to simulate the behavior of the compliant member 300 under different process conditions. Adhesion property data from the bonded interface from actual tests was used in the modeling study. The modeling study showed that a compliant member 300 comprising a polymer adhesive had enough flexibility to take the strain to accept the thermal expansion strain mismatch without failure. In addition, the modeling results were compared to the actual adhesion property measurements.

Heat Transfer Gas Testing

The ability of the compliant member 300 to provide a reliable seal for the heat transfer gas conduits passing therethrough and around the circumference of the support 55 was tested in a special fixture. The results indicated little or no helium leaks as measured by a sensitive helium leak detector. In these tests, the conduit for passage of the heat transfer gas through the support 55 was placed at 3 or 10 mil from the edge of the support 55 to provide a good measure of sealability.

Dye Penetrant Test

Standard dye penetrant tests with the red dye were used to identify the integrity of the bonding interfaces at both surfaces of the compliant member 300 and around the circumference of the support 55 to detect any disbonded regions. None were seen.

While the present invention has been described in considerable detail with reference to certain preferred versions, many other versions should be apparent to those of ordinary skill in the art. For example, other types of dielectric electrical connectors, electrodes, and joining methods may be used. In addition, the support 55 may be used in other chambers, such as deposition chambers, for example CVD or PVD chambers. Therefore, the spirit and scope of the appended claims should not be limited to the description of the preferred versions contained herein.

What is claimed is:

1. A support capable of supporting a substrate during processing, the support comprising:
   (a) a dielectric enveloping an electrode;
   (b) a base below the dielectric; and
   (c) a compliant member comprising a polymer layer bonding the dielectric to the base, the polymer layer comprising a thermoplastic adhesive having an elastic modulus of less than about $100 \times 10^3$ psi to withstand a coefficient of thermal expansion mismatch of at least about 15% between the dielectric and the base.

2. A support according to claim 1 wherein the polymer layer comprises a coefficient of thermal expansion of at least about 10 ppm/°C.

3. A support according to claim 1 wherein the polymer layer comprises an elastic modulus of from about $10 \times 10^3$ to about $100 \times 10^3$ psi.

4. A support according to claim 1 wherein the compliant member comprises a thermal conductivity of at least about 1 W/(m-°C.).

5. A support according to claim 4 wherein the compliant member comprises particulates, the particulates having a thermal conductivity of from about 2 to about 200 w/m-k.

6. A support according to claim 5 wherein the volume fraction of particulates is from about 20 to about 50%.

7. A support according to claim 5 wherein the particulates comprise $TiB_2$, AlN, $Al_2O_3$, BN or mixtures thereof.

8. A support according to claim 1 wherein the compliant member comprises a metal matrix.

9. A support according to claim 1 wherein the dielectric and base comprise alignable bores, and further comprising a ring around the interface of the bores.

10. A support according to claim 1 wherein the dielectric comprises ceramic and the base comprises metal.

11. A support according to claim 1 wherein the polymer layer is adapted to withstand a thermal expansion mismatch between the dielectric and the base of less than about 600%.

12. A chamber capable of processing a substrate, the chamber comprising:
    (a) a support comprising a dielectric enveloping an electrode, a base capable of supporting the dielectric, and a compliant member comprising a polymer layer bonding the dielectric to the base, the polymer layer comprising a thermoplastic adhesive having an elastic modulus of less than about $100 \times 10^3$ psi to withstand a coefficient of thermal expansion mismatch of at least about 15% between the dielectric and the base;
    (b) a gas distributor;
    (c) a gas energizer; and
    (d) an exhaust,
whereby a substrate supported on the support is capable of being processed by a process gas distributed by the gas distributor, energized by the gas energizer, and exhausted by the exhaust.

13. A chamber according to claim 12 wherein the thermoplastic adhesive comprises a bonding temperature that is between an operating temperature of the dielectric and an operating temperature of the base.

14. A chamber according to claim 12 wherein the thermoplastic adhesive comprises a bonding temperature of from about 20 to about 150° C.

15. A chamber according to claim 12 wherein the dielectric comprises a bore and further comprising a ring around the bore.

16. A chamber according to claim 15 wherein the ring comprises a thickness th corresponds to a desirable thickness of the compliant member.

17. A chamber according to claim 16 comprising the ring is composed of polymer.

18. A chamber according to claim 12 wherein the polymer layer is adapted to withstand a thermal expansion mismatch between the dielectric and the base of less than about 600%.

19. A chamber according to claim 12 wherein the dielectric comprises a ceramic material and the base comprises a metal.

20. A support for supporting a substrate in a chamber, the support comprising:
    (a) a ceramic dielectric having a surface capable of receiving the substrate;
    (b) an electrode below the ceramic dielectric;
    (c) an electrical connector extending through the ceramic dielectric to electrically connect to the electrode; and
    (d) a polymer between the ceramic dielectric and the electrical connector to fill microcracks in the ceramic dielectric.

21. A support according to claim 20 wherein the polymer comprises an adhesive.

22. A support according to claim 21 wherein the adhesive comprises a cyanoacrylate.

23. A support according to claim 22 wherein the cyanoacrylate comprise methyl, ethyl, propyl, butyl, methoxyethyl or allylester cyanoacrylates or mixtures thereof.

24. A support according to claim 20 wherein the polymer is also in microcracks around the electrode.

25. A support according to claim 20 wherein the polymer substantially fills a gap around the electrical connector.

26. A support according to claim 25 wherein gap comprises an annular shape.

27. A support according to claim 20 wherein the electrode is adapted to electrostatically hold the substrate, energize a plasma of a process gas, or both.

28. A support according to claim 20 further comprising a base and a polymer layer between the ceramic dielectric and the base.

29. A substrate processing chamber comprising:
    (a) a support having a surface capable of receiving a substrate, the support comprising a ceramic dielectric enveloping an electrode, an electrical connector extending through the ceramic dielectric to connect to the electrode, and a polymer between the ceramic dielectric and the electrical connector to fill microcracks in the ceramic dielectric;
    (b) a gas distributor;
    (c) a gas energizer; and
    (d) an exhaust,
whereby a substrate supported on the support is capable of being processed by a process gas distributed by the gas distributor, energized by the gas energizer, and exhausted by the exhaust.

30. A chamber according to claim 29 wherein the polymer comprises an adhesive.

31. A chamber according to claim 30 wherein the adhesive comprises a cyanoacrylate.

32. A chamber according to claim 29 wherein the polymer substantially fills a gap around the electrical connector.

33. A support capable of supporting a substrate during processing, the support comprising:
    (a) a dielectric enveloping an electrode;
    (b) a base below the dielectric; and
    (c) a compliant member comprising a polymer layer between the dielectric and the base, the polymer layer comprising an adhesive having a bonding temperature that is between an operating temperature of the support and an operating temperature of the base.

34. A support according to claim 33 wherein the polymer layer comprises a coefficient of thermal expansion of at least about 10 ppm/°C.

35. A support according to claim 33 the polymer layer is adapted to withstand a thermal expansion mismatch between the dielectric and the base of at least about 15%.

36. A support according to claim 33 wherein the polymer layer comprises an elastic modulus of from about $10 \times 10^3$ to about $100 \times 10^3$ psi.

37. A support according to claim 33 wherein the compliant member comprises a thermal conductivity of at least about 1 W/m-°C.

38. A support according to claim 37 wherein the compliant member comprises particulates, the particulates having a thermal conductivity of from about 2 to about 200 W/m-K.

39. A support according to claim 38 wherein the volume fraction of particulates is from about 20 to about 50%.

40. A support according to claim 38 wherein the particulates comprise $TiB_2$, AlN, $Al_2O_3$, BN or mixtures thereof.

41. A support according to claim 33 wherein the compliant member comprises a metal matrix.

42. A support according to claim 33 wherein the dielectric and base comprise alignable bores, and further comprising a ring around the interface of the bores.

43. A support according to claim 33 wherein the polymer layer comprises a thermoplastic adhesive.

44. A support according to claim 43 wherein the thermoplastic adhesive is capable of softening and bonding the dielectric to the base under a pressure of from about 10 to about 25 psi and at a temperature of from about 30 to about 120° C.

45. A chamber capable of processing a substrate, the chamber comprising:
   (a) a support comprising a dielectric enveloping an electrode, a base capable of supporting the dielectric, and a compliant member comprising a polymer layer between the dielectric and the base, the polymer layer comprising an adhesive having a bonding temperature that is between an operating temperature of the dielectric and an operating temperature of the base;
   (b) a gas distributor;
   (c) a gas energizer; and
   (d) an exhaust,
whereby a substrate supported on the support is capable of being processed by a process gas distributed by the gas distributor, energized by the gas energizer, and exhausted by the exhaust.

46. A chamber according to claim 45 wherein the dielectric, compliant member and base are bonded to one another.

47. A chamber according to claim 45 wherein the adhesive comprises a bonding temperature of from about 20 to about 150° C.

48. A chamber according to claim 45 wherein the dielectric comprises a bore and further comprising a ring around the bore.

49. A chamber according to claim 48 wherein the ring comprises a thickness that corresponds to a desirable thickness of the compliant member.

50. A chamber according to claim 49 wherein the ring comprises a polymer.

51. A chamber according to claim 45 wherein the compliant member comprises a metal matrix.

52. A chamber according to claim 45 wherein the adhesive is capable of softening and bonding the dielectric to the base under a pressure of from about 10 to about 25 psi and at a temperature of about 30 to about 120° C.

53. A support capable of supporting a substrate during processing, the support comprising:
   (a) a dielectric enveloping an electrode;
   (b) a base below the dielectric; and
   (c) a compliant member comprising a polymer layer bonding the dielectric to the base, the polymer layer comprising a thermoplastic adhesive having an attachment temperature of from about 125 to about 200° C.

54. A support according to claim 53 wherein the polymer layer is adapted to withstand a thermal expansion mismatch between the dielectric and the base of at least about 15%.

55. A support according to claim 53 wherein the polymer layer comprises an elastic modulus of from about $10 \times 10^3$ to about $100 \times 10^3$ psi.

56. A support according to claim 53 wherein the compliant member comprises a thermal conductivity of at least about 1 W/(m-°C.).

57. A support according to claim 56 wherein the compliant member comprises particulates, the particulates having a thermal conductivity of from about 2 to about 200 W/m-K.

58. A support according to claim 57 wherein the volume fraction of particulates is from about 20 to about 50 %.

59. A support according to claim 57 wherein the particulates comprise $TiB_2$, AlN, $Al_2O_3$, BN or mixtures thereof.

60. support according to claim 53 wherein the compliant member comprises a metal matrix.

61. support according to claim 53 wherein the thermoplastic adhesive is capable of softening and bonding the dielectric to the base under a pressure of from about 10 to about 25 psi and at a temperature of from about 30 to about 120° C.

62. A chamber capable of processing a substrate, the chamber comprising:
   (a) a support comprising a dielectric enveloping an electrode, a base capable of supporting the dielectric, and a compliant member comprising a polymer layer bonding the dielectric to the base, the polymer layer comprising a thermoplastic adhesive having an attachment temperature of from about 125 to about 200° C.;
   (b) a gas distributor;
   (c) a gas energizer; and
   (d) an exhaust,
whereby a substrate supported on the support is capable of being processed by a process gas distributed by the gas distributor, energized by the gas energizer, and exhausted by the exhaust.

63. A chamber according to claim 62 wherein the dielectric comprises a bore and further comprising a ring around the bore.

64. A chamber according to claim 63 wherein the ring comprises a thickness that corresponds to a thickness of the compliant member.

65. A chamber according to claim 64 comprising the ring composed of polymer.

* * * * *